United States Patent [19]

Komoda

[11] Patent Number: 5,379,232
[45] Date of Patent: Jan. 3, 1995

[54] LOGIC SIMULATOR

[75] Inventor: Michio Komoda, Itami, Japan

[73] Assignee: Mitsubishi Denki Kabushiki Kaisha, Tokyo, Japan

[21] Appl. No.: 878,614

[22] Filed: May 5, 1992

[30] Foreign Application Priority Data

Aug. 22, 1991 [JP] Japan .................................. 3-210584

[51] Int. Cl.6 ............................................. G06F 15/60
[52] U.S. Cl. ................................... 364/489; 364/488; 364/490; 364/578
[58] Field of Search ............... 364/488, 489, 490, 491, 364/578

[56] References Cited

U.S. PATENT DOCUMENTS

| | | | |
|---|---|---|---|
| 5,168,455 | 12/1992 | Hooper | 364/488 |
| 5,198,986 | 3/1993 | Ikeda et al. | 364/489 |
| 5,210,700 | 5/1993 | Tom | 364/488 |
| 5,218,551 | 6/1993 | Agrawal et al. | 364/488 |
| 5,247,455 | 9/1993 | Yoshikawa | 364/488 |

OTHER PUBLICATIONS

Proceedings of the IEEE 1987 Custom Integrated Circuits Conference, May 4, 19887, pp. 137–141, Chang, et al., "Full-Chip RC Routing Extraction and Delay Analysis".

High Performance Systems, vol. 11, No. 5, May 1990, Richard Georing, "Asic Advances", 8 pages.

Primary Examiner—Thomas G. Black
Assistant Examiner—Stephen J. Walder, Jr.
Attorney, Agent, or Firm—Oblon, Spivak, McClelland, Maier & Neustadt

[57] ABSTRACT

There is disclosed a logic simulator having a wiring load extraction function which is capable of accurately calculating characteristic data of wiring loads when wirings are shortly spaced. A wiring region dividing unit (1) and a wiring load model generator (3) convert a wiring layout data (D10) into a wiring load model circuit data (D12) including wiring load models respectively for divided wiring regions into which a wiring is divided as a function of the number of adjacent wirings. A wiring load distributed constant calculator (4) extracts characteristic parameters in accordance with the number of adjacent wirings of each of the wiring load models in the circuit data (D12) from a unit length wiring characteristic parameter group (D13) including different characteristic parameters in accordance with the number of adjacent wirings, to output a distributed constant circuit data (D14) including the characteristic data of the respective wiring load models as a function of the characteristic parameters and the wiring lengths of the respective wiring load models. This enables the characteristic data of the wiring loads to be calculated with high accuracy.

10 Claims, 13 Drawing Sheets

LOGIC SIMULATOR

BACKGROUND OF THE INVENTION

1. Field of the Invention

The present invention relates to a logic simulator which functions to determine characteristic data of wiring loads of a logic circuit formed by a predetermined layout pattern.

2. Description of the Background Art

Figure 16:
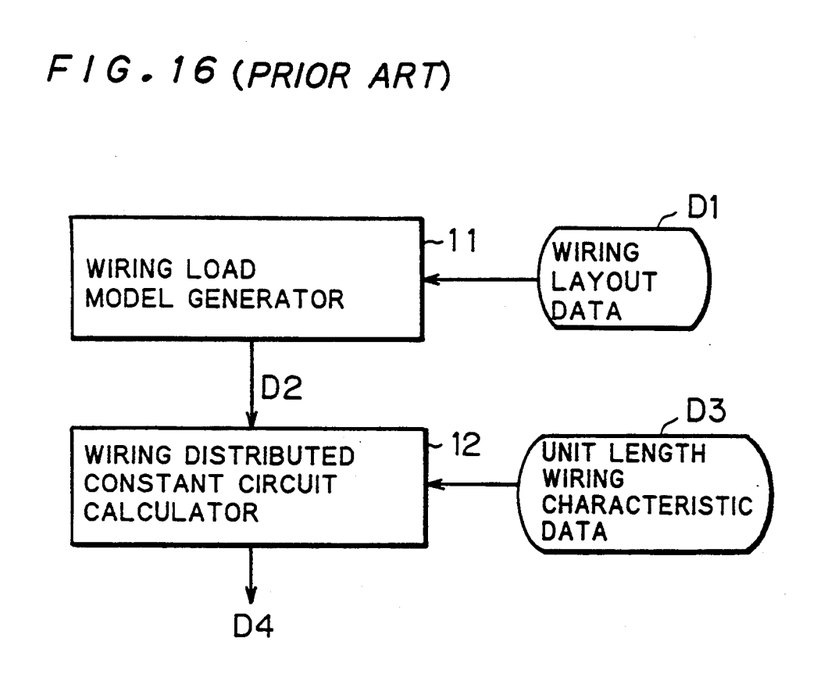
FIG. 16 is a block diagram of a conventional logic simulator.

FIG. 16 is a block diagram of a conventional wiring load extractor for an RC model. A wiring load model generator 11 receives a wiring layout (pattern) data D1 which forms a logic circuit to generate a wiring load model circuit data D2, which is outputted to a wiring distributed constant circuit calculator 12.

Figure 17:
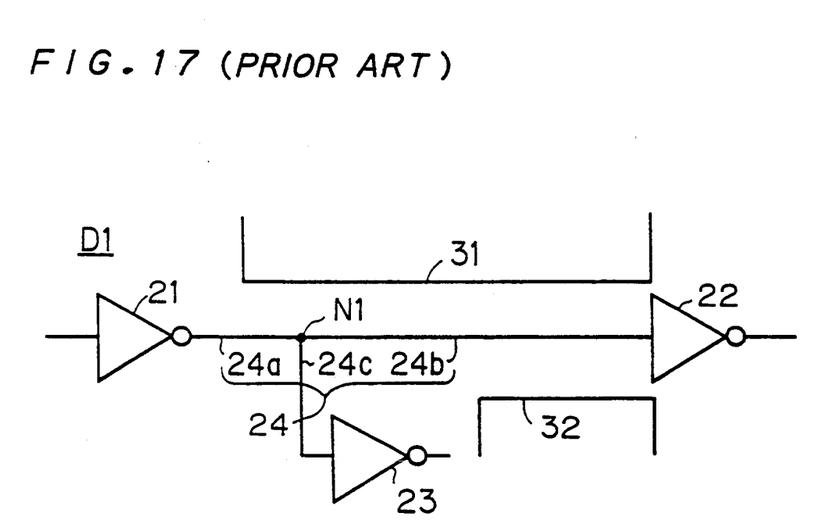
FIG. 17 illustrates an example of the wiring layout pattern data.

FIG. 17 illustrates an example of the wiring layout data D1. In FIG. 17, reference numerals 21 to 23 designate inverters; 24 (24a to 24c) designates a wiring formed between an output of the inverter 21 and inputs of the inverters 22 and 23; reference character N1 designates branch point of the wiring 24; and 31 and 32 designate other adjacent wirings which are not directly connected to the wiring 24.

Figure 18:
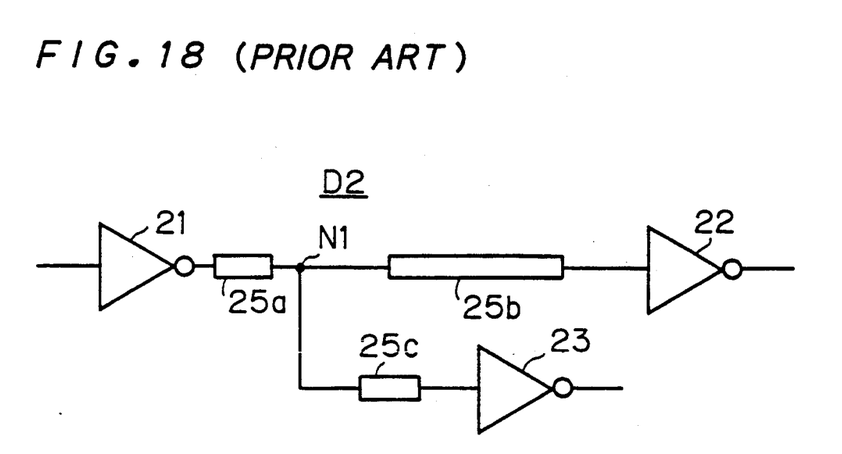
FIG. 18 illustrates an example of the wiring load model circuit data.

The wiring load model generator 11, where receiving the wiring layout data D1 shown in FIG. 17, divides the wiring 24 at the branch point N1 into divided wiring regions 24a, 24b and 24c, to output the wiring load model circuit data D2 including wiring load models 25a to 25c for the divided wiring regions 24a to 24c respectively, as shown in FIG. 18.

The wiring distributed constant circuit calculator 12 receives the wiring load model circuit data D2 and a unit length wiring characteristic data D3 and multiplies the wiring length of the respective wiring load models in the wiring load model circuit data D2 by the unit length wiring characteristic data D3, to thereby calculate distributed constants (resistance R and capacitance C) which are the characteristic data of the respective wiring load models and output a distributed constant circuit data D4.

As a function of the distributed constant circuit data D4, a delay time calculator not shown calculates a signal propagation delay time of the logic circuit for the RC model.

When the wiring load models are formed on the wiring, the wiring load extractor in the conventional logic simulator thus structured disregards the presence of other adjacent wirings which are not directly connected to the wiring in calculation of the characteristic data of the wiring load models. In the wiring layout data D1 shown in FIG. 17, for example, the distributed constants of the wiring load models 25a to 25c are determined without consideration of the presence of the adjacent wirings 31 and 32 which are not directly connected to the wiring 24.

In practice, however, inter-wiring parasitic elements which lie between the wiring and its adjacent wirings cause the distributed constants of the wiring to change. Hence there arises a problem that the distributed constants of the wiring load models calculated by the conventional method are inaccurate, resulting in the inaccurate signal propagation delay time calculated by using the distributed constants. This problem tends to be not negligible since recent advances in manufacturing process decrease intervals between adjacent wirings.

SUMMARY OF THE INVENTION

The present invention is intended for a logic simulator which functions to determine characteristic data of a wiring load of a logic circuit formed by a predetermined layout pattern. According to the present invention, the logic simulator comprises layout pattern data feed means for feeding a layout pattern data specifying the layout pattern of the logic circuit; wiring characteristic data storage means for storing characteristic parameters which are the characteristic data per unit length in corresponding relation to a plurality of types of wiring load models classified by a characteristic of a parasitic element incidental to a wiring; wiring load model setting means for setting the wiring load models specified by the characteristic of the parasitic element incidental to the wiring on the wiring between elements of the logic circuit as a function of the layout pattern data to output a wiring load model circuit data; and characteristic data calculation means receiving from the characteristic data storage means the characteristic parameters corresponding to the wiring load models of the wiring load model circuit data for calculating the characteristic data of the wiring load models as a function of the characteristic parameters and wiring lengths of the wiring load models to output a calculated characteristic data wiring load model circuit data.

According to the present invention, the wiring load model setting means sets the wiring load models specified by the characteristic of the parasitic element incidental to the wiring on the wiring between the elements of the logic circuit as a function of the layout pattern data, to output the wiring load model circuit data. The characteristic data calculation means receives from the characteristic data storage means the characteristic parameters corresponding to the wiring load models in the wiring load model circuit data to calculate the characteristic data of the wiring load models as a function of the characteristic parameters and the wiring lengths of the wiring load models.

As a result, the characteristic data of the wiring load models which are calculated by the characteristic data calculation means include the effect of the parasitic element such as the inter-wiring parasitic element generated between the wiring and its adjacent wirings which are not directly connected to the wiring. Therefore, there are provided characteristic data of accurate wiring loads when the wiring and its adjacent wirings are shortly spaced.

An object of the present invention is to provide a logic simulator having a wiring load extraction function which is capable of accurately calculating characteristic data of wiring load models when wirings are shortly spaced.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
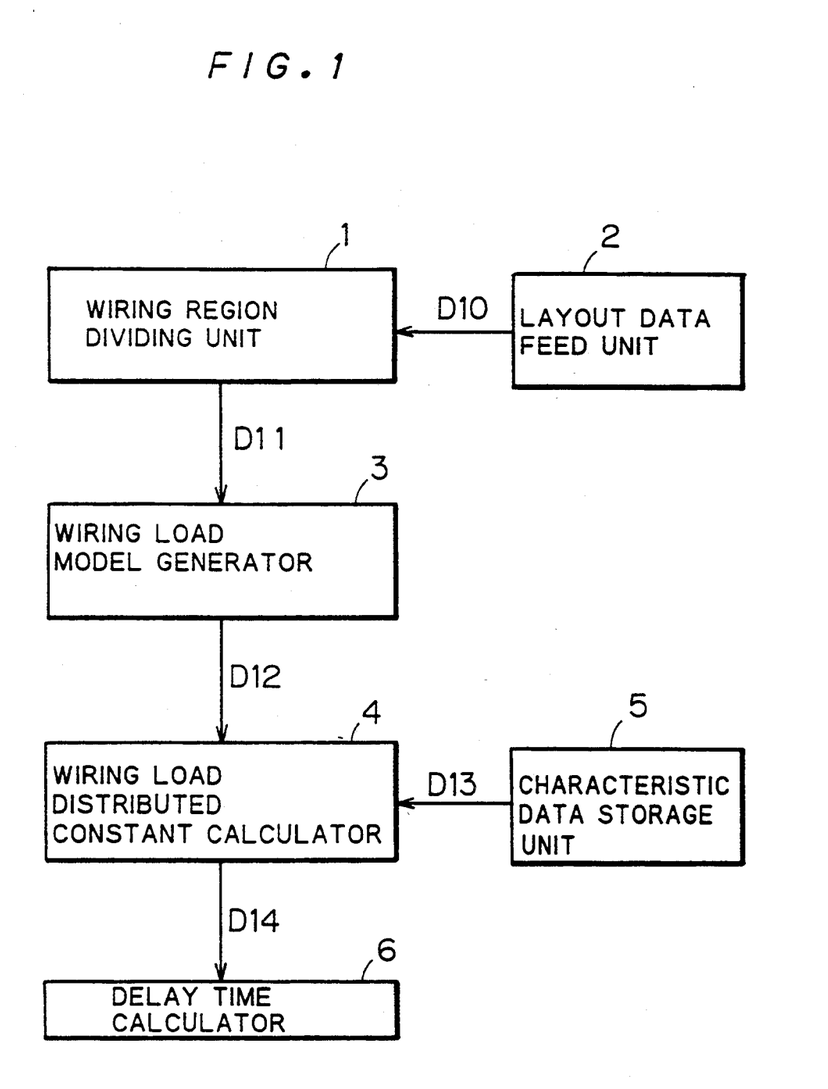
FIG. 1 is a block diagram of a logic simulator of a first preferred embodiment according to the present invention.

FIG. 1 is a block diagram partially showing a logic simulator of a first preferred embodiment according to the present invention. A wiring region dividing unit 1 receives a wiring layout (pattern) data D10 from a layout (pattern) data feed unit 2 and performs on the wiring layout data D10 a wiring dividing processing based on branch points and the number of adjacent wirings, to output a divided wiring circuit data D11 to a wiring load model generator 3.

Figure 2:
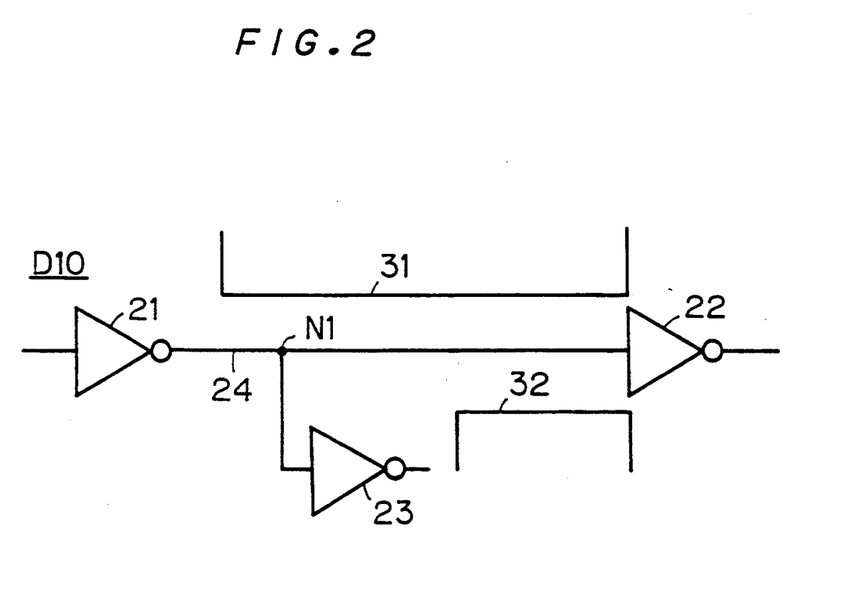
FIG. 2 illustrates an example of wiring layout pattern data.

FIG. 2 is a circuit diagram showing an example of the wiring layout data D10. In FIG. 2, reference numerals 21 to 23 designate inverters; 24 (24a to 24c) designates a wiring formed between an output of the inverter 21 and inputs of the inverters 22 and 23; reference character N1 designates a branch point of the wiring 24; and 31 and 32 designate other adjacent Wirings which are not directly connected to the wiring 24.

Figure 3:
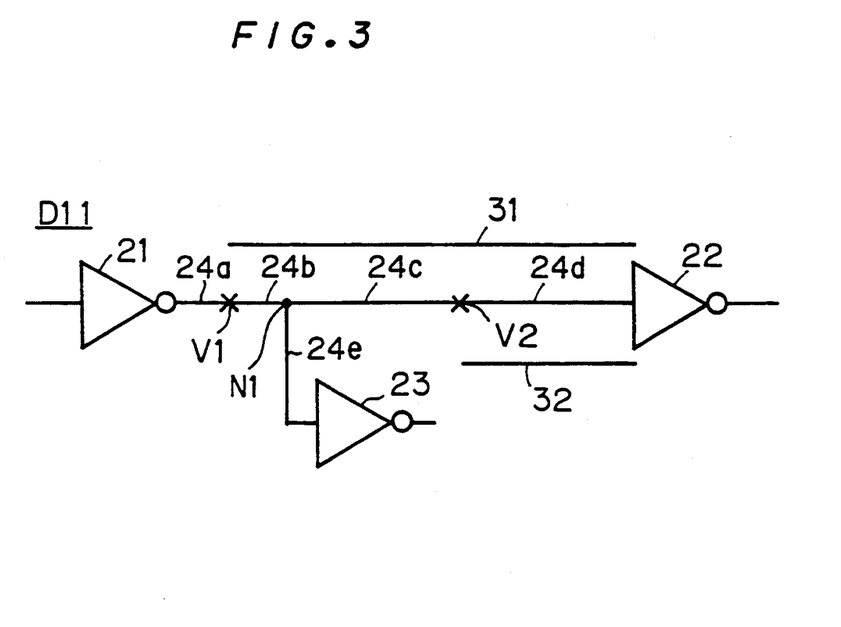
FIG. 3 illustrates an example of divided wiring circuit data.

The wiring region dividing unit 1, where receiving the wiring layout data D10 shown in FIG. 2 from the layout data feed unit 2, divides the wiring 24 not only at the branch point N1 similarly to the prior art but also at dividing points V1 and V2 at which the number of adjacent wirings changes from zero to one and from one to two respectively as shown in FIG. 3, to thereby output the divided wiring circuit data D11 including divided wiring regions 24a to 24e.

The wiring load model generator 3 receives the divided wiring circuit data D11 to output a wiring load model circuit data D12 including a wiring load model for each of the divided wiring regions to a wiring load distributed constant calculator 4.

Figure 4:
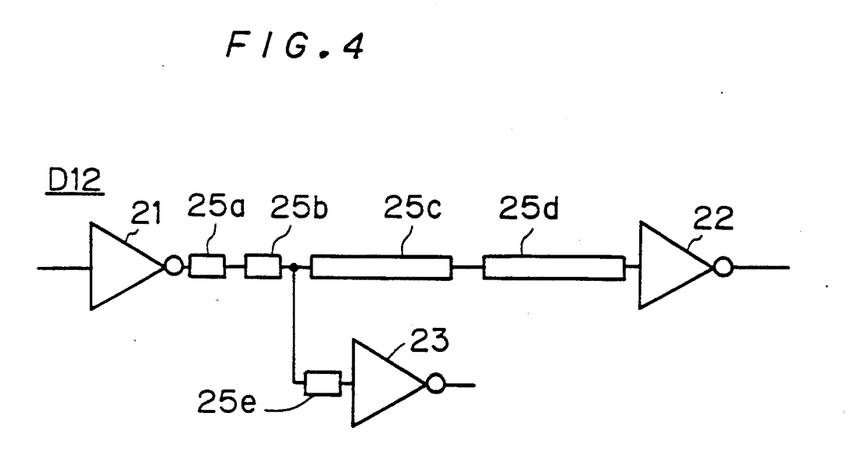
FIG. 4 illustrates an example of wiring load model circuit data.

For example, the wiring load model generator 3, where receiving the divided wiring circuit data D11 shown in FIG. 3, outputs the wiring load model circuit data D12 including the wiring load models 25a to 25e for the divided wiring regions 24a to 24e respectively, as shown in FIG. 4. The wiring load models 25a and 25e have no adjacent wiring The wiring load models 25b and 25d have one adjacent wiring respectively. The wiring load model 25c has two adjacent wirings.

A characteristic data storage unit 5 stores a plurality of characteristic parameters which are characteristic data of the wiring per unit length in the form of a unit length wiring characteristic data group D13. The characteristic parameters have different values in accordance with the number of adjacent wirings, from zero to two, of the wiring load model.

The wiring load distributed constant calculator 4 receives the wiring load model circuit data D12 and also receives the unit length wiring characteristic data group D13 from the characteristic data storage unit 5. The wiring load distributed constant calculator 4 extracts the characteristic parameter in accordance with the number of adjacent wirings of the respective wiring load models and multiplies the characteristic parameter by the wiring length of the wiring load models, to thereby calculate distributed constants (resistance R and capacitance C) which are the characteristic data of the wiring load models and output a distributed constant circuit data D14 to a delay time calculator 6.

The delay time calculator 6 calculates a signal propagation delay time of a logic circuit for an RC model as a function of the distributed constant circuit data D14.

Figure 5:
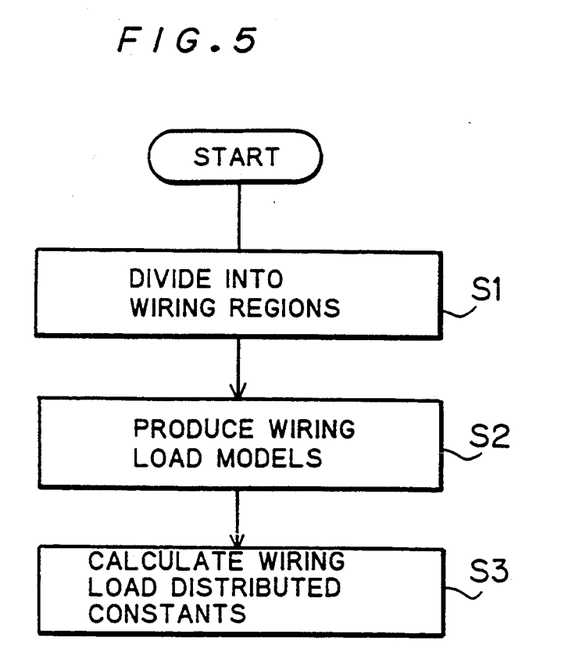
FIG. 5 is a flow chart of a wiring load extraction operation of the logic simulator of the first preferred embodiment.

FIG. 5 is a flow chart of a wiring load extraction operation of the logic simulator of FIG. 1.

With reference to FIG. 5, the wiring region dividing unit 1 performs the wiring dividing processing based on the branch points and the number of adjacent wirings on the wiring layout data D1 given from the layout data feed unit 2 to output the divided wiring circuit data D11 to the wiring load model generator 3 in the step S1.

In the step S2, the wiring load model generator 3 outputs to the wiring load distributed constant calculator 4 the wiring load model circuit data D12 including the wiring load models for the respective divided wiring regions in the divided wiring circuit data D11.

In the step S3, the wiring load distributed constant calculator 4 receives the wiring load model circuit data D12 and also receives the unit length wiring characteristic data group D13 from the characteristic data storage unit 5. The wiring load distributed constant calculator 4 calculates the distributed constants (resistance R and capacitance C) of the respective wiring load models as a function of the data D12 and D13 to output the distributed constant circuit data D14.

In the first preferred embodiment, the number of adjacent wirings is considered in dividing the wiring to form the divided wiring regions. The distributed constants of the wiring load models generated for the respective divided wirings are calculated in accordance with the number of adjacent wirings. This provides for the determination of the accurate distributed constants of the wiring load models in consideration of the presence of inter-wiring parasitic elements which lie between the wiring and its adjacent wirings, and improvement in accuracy of the signal propagation delay time to be calculated as a function of the wiring load models.

Figure 6:
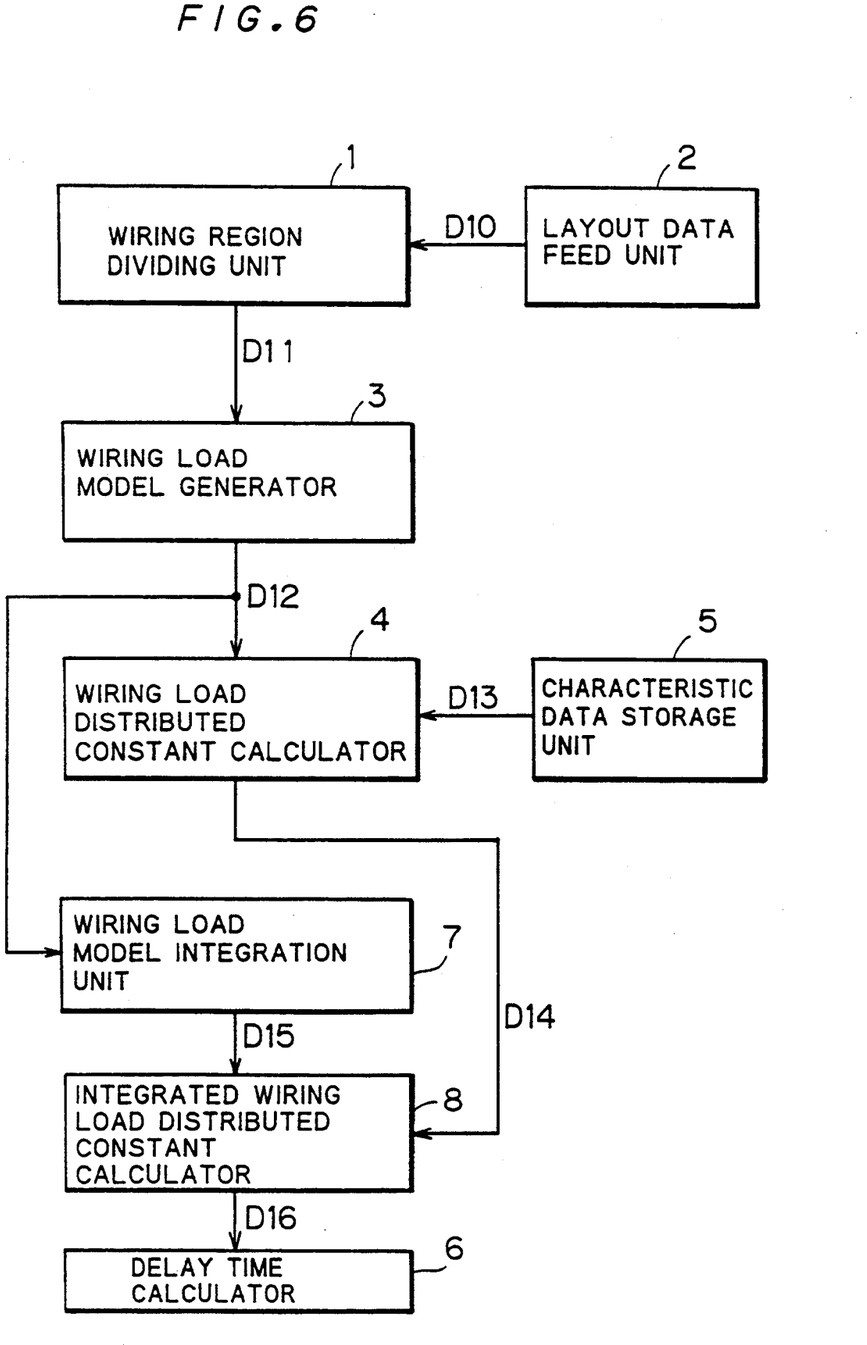
FIG. 6 is a block diagram of the logic simulator of a second preferred embodiment according to the present invention.

FIG. 6 is a block diagram partially showing the logic simulator of a second preferred embodiment according to the present invention. Since the units 1 to 5 and data D10 to D14 of FIG. 6 are similar to those of the first preferred embodiment, the description thereof will be omitted.

A wiring load model integration unit 7 receives the wiring load model circuit data D12 from the wiring load model generator 3 and outputs to an integrated wiring load distributed constant calculator 8 an integrated wiring load model circuit data D15 which is obtained by integrating the wiring load models in the wiring load model circuit data D12 into an integrated wiring load model.

Figure 7:
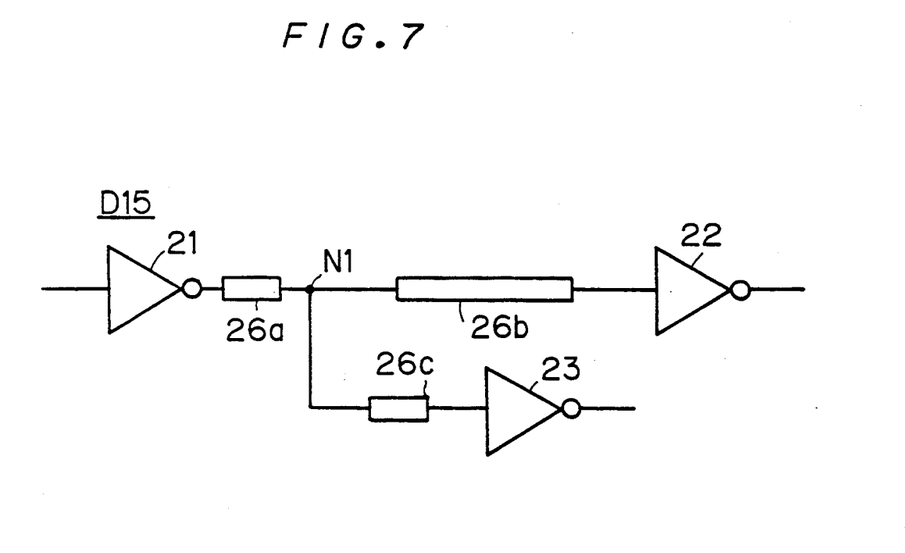
FIG. 7 illustrates an example of integrated wiring load model circuit data.

For example, when the wiring load model circuit data D12 includes the wiring load models of FIG. 4, five wiring load models 25a to 25d between the inverters 23, 22 and 23 are integrated into three integrated wiring load models 26a to 26c as shown in FIG. 7. That is, the integrated wiring load models are equal in number to the conventional wiring load models obtained by the division at the branch point N1. The two wiring load models 25a and 25b are integrated into the single integrated wiring load model 26a, and the two wiring load models 25c and 25d are integrated into the single integrated wiring load model 26d.

On receiving the integrated wiring load model circuit data D15, the integrated wiring load distributed constant calculator 8 calculates the distributed constants (resistance R and capacitance C) of the respective integrated wiring load models with reference to the distributed constant circuit data D14 to output an integrated distributed constant circuit data D16 to the delay time calculator 6.

The delay time calculator 6 calculates the signal propagation delay time of the logic circuit for the RC model as a function of the integrated distributed constant circuit data D16.

Figure 8:
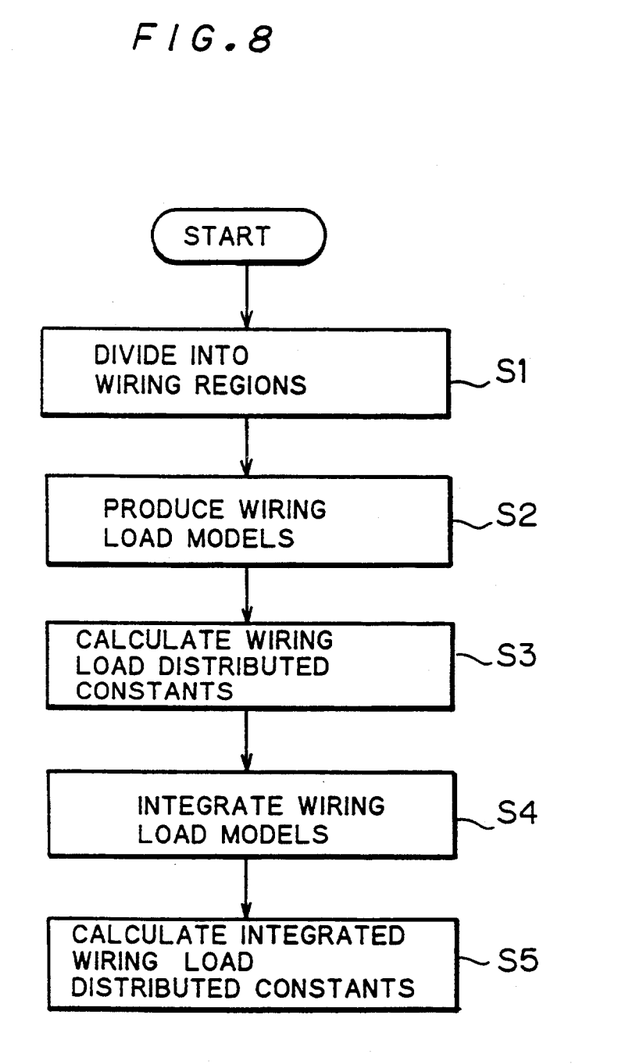
FIG. 8 is a flow chart of the wiring load extraction operation of the logic simulator of the second preferred embodiment.

FIG. 8 is a flow chart of the wiring load extraction operation of the simulator of the second preferred embodiment. Since the steps S1 to S3 of FIG. 8 are similar to those of the first preferred embodiment, the description thereof will be omitted.

In the step S4, the wiring load model integration unit 7 integrates the wiring load models in the wiring load model circuit data D12 received from the wiring load model generator 3 into groups obtained by the division only at the branch points. That is, one integrated wiring load model is made from one or more wiring load models. The wiring load model integration unit 7 outputs the integrated wiring load model circuit data D15 thus obtained to the integrated wiring load distributed constant calculator 8.

In the step S5, the integrated wiring load distributed constant calculator 8 calculates the distributed constants (resistance R and capacitance C) of the respective integrated wiring load models as a function of the integrated wiring load model circuit data D15 and the distributed constant circuit data D14 before integration to output the integrated distributed constant circuit data D16.

The structure of the second preferred embodiment enables the integrated wiring load models to be equal in number to the wiring load models of the prior art, so that the time period required for the delay time calculation in the delay time calculator 6 is the same as in the prior art, and the volume of the integrated distributed constant circuit data D16 is not larger than that of the data of the prior art.

Figure 9:
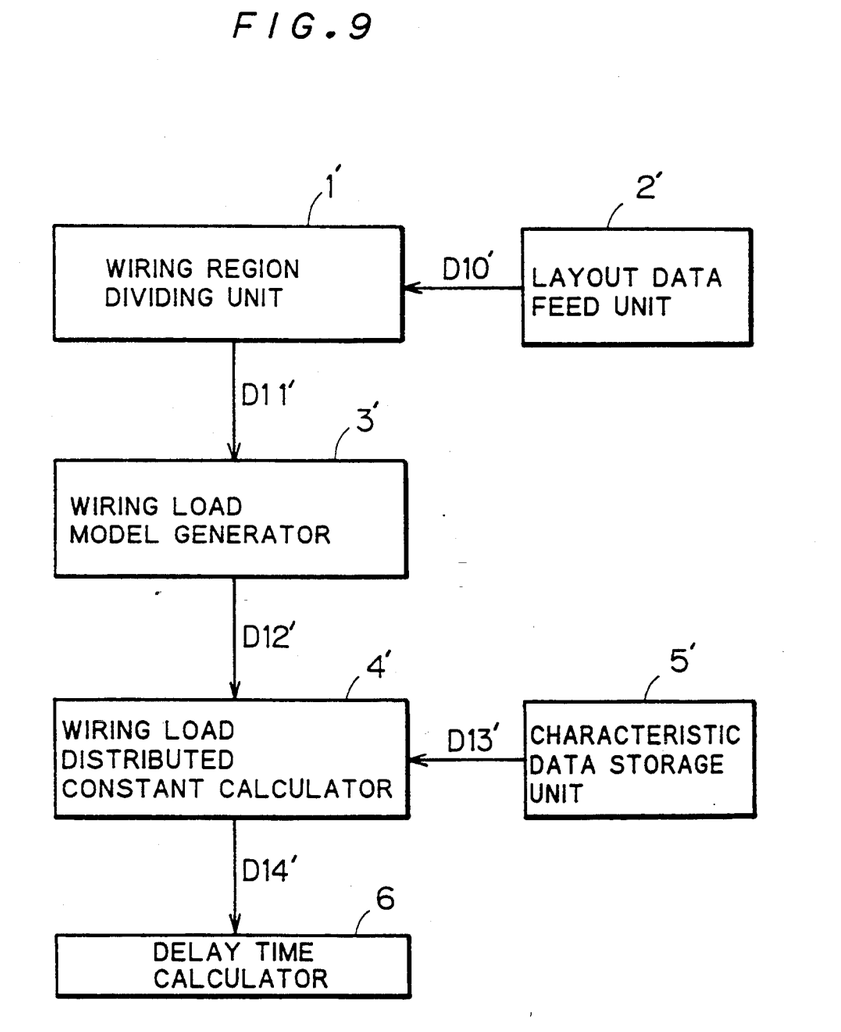
FIG. 9 is a block diagram of the logic simulator of a third preferred embodiment according to the present invention.

FIG. 9 is a block diagram partially showing the logic simulator of a third preferred embodiment according to the present invention. A wiring region dividing unit 1' receives a wiring layout data D10' from a layout data feed unit 2' and performs on the wiring layout data D10' wiring dividing processing based on the branch points, number of adjacent wirings and an effect of a cross wiring to output a divided wiring circuit data D11' to a wiring load model generator 3'.

Figure 10:
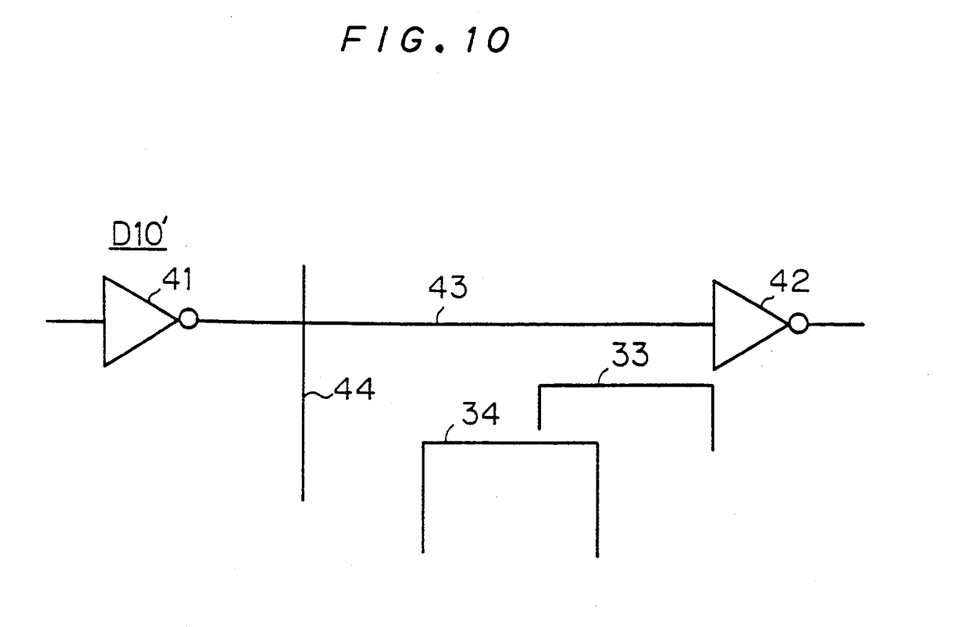
FIG. 10 illustrates an example of the wiring layout pattern data.

FIG. 10 is a circuit diagram showing an example of the wiring layout data D10' having a cross wiring. In FIG. 10, reference numerals 41 and 42 designate inverters; 43 designates a wiring between the inverters; 33 and 34 designate other adjacent wirings which are not directly connected to the wiring 43; and 44 designates a cross wiring which is not directly connected to the wiring 43.

Figure 11:
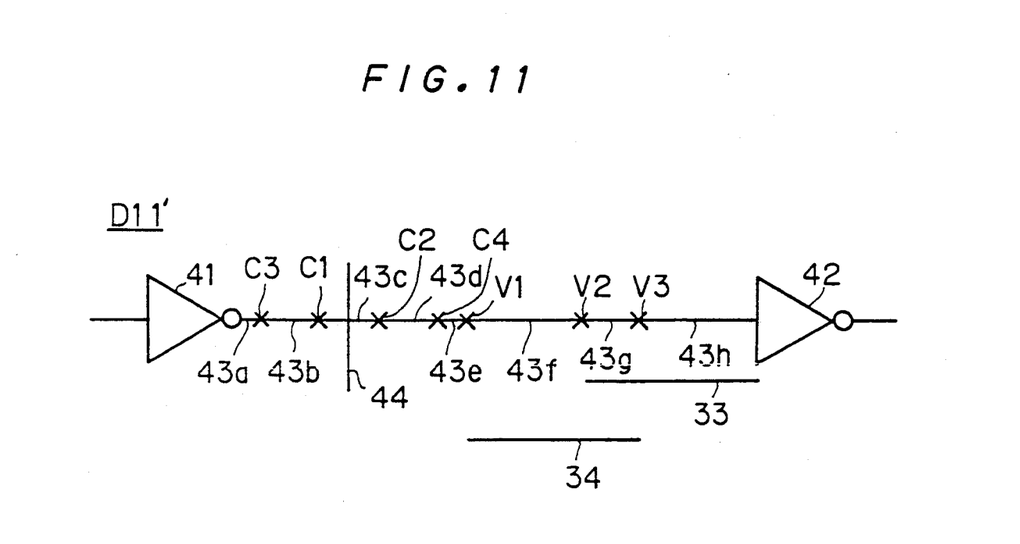
FIG. 11 illustrates an example of the divided wiring circuit data.

The wiring region dividing unit 1', where receiving the wiring layout data D10' shown in FIG. 10 from the layout data feed unit 2', utilizes the number of wirings adjacent to the wiring 43 to advantage similarly to the first and second preferred embodiments, to divide the wiring 43 not only at the dividing point V1 at which the number of adjacent wirings changes from zero to one and at the dividing points V2 and V3 at which the number of adjacent wirings changes from one to two but also at strong effect limit points C1 and C2 of the cross wiring 44 and at weak effect limit points C3 and C4 of the cross wiring 44 as shown in FIG. 11, so that the wiring region dividing unit 1' outputs the divided wiring circuit data D11' including divided wiring regions 43a to 43h.

The wiring load model generator 3' receives the divided wiring circuit data D11' and generates a wiring load model circuit data D12' including the wiring load model for each of the divided wirings to output the wiring load model circuit data D12' to a wiring load distributed constant calculator 4'.

Figure 12:
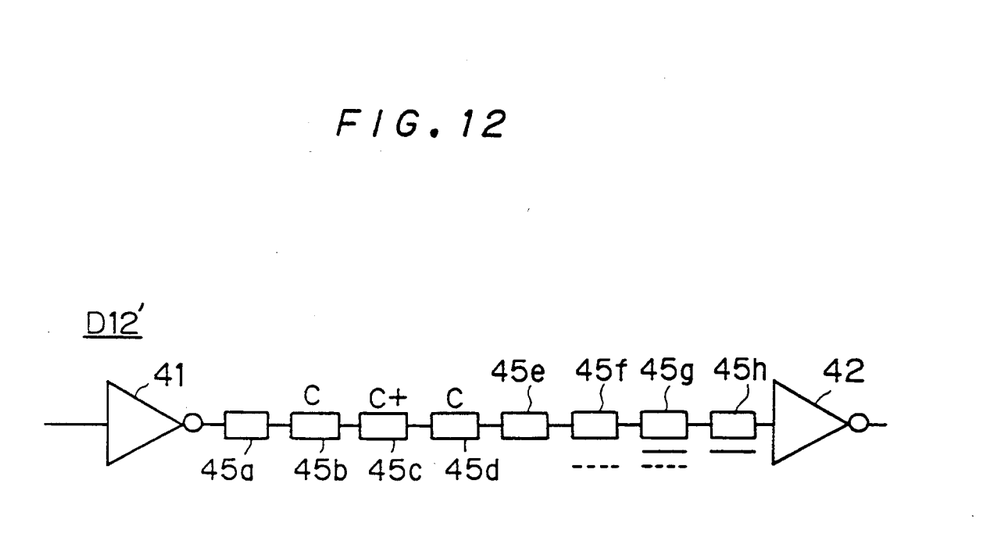
FIG. 12 illustrates an example of the wiring load model circuit data.

For example, the wiring load model generator 3', where receiving the divided wiring circuit data D11' shown in FIG. 11, outputs the wiring load model circuit data D12' including the wiring load models 45a to 45h for the divided wirings 43a to 43h respectively, as shown in FIG. 12. The wiring load models 45a and 45e have no adjacent wiring and are not affected by the cross wiring 44. The wiring load models 45b and 45d are weakly affected by the cross wiring 44. The wiring load model 45c is strongly affected by the cross wiring 44. The wiring load models 45f and 45h have one adjacent wiring respectively. The wiring load model 45g has two adjacent wirings.

A characteristic data storage unit 5' stores a plurality of characteristic parameters which are characteristic data of the wiring per unit length in the form of a unit length wiring characteristic data group D13'. The characteristic parameters have different values in accordance with the number of adjacent wirings, from zero to two, of the wiring load model and the degree of the effect of the cross wiring.

The wiring load distributed constant calculator 4' receives the wiring load model circuit data D12' and also receives the unit length wiring characteristic data group D13' from the characteristic data storage unit 5'. The wiring load distributed constant calculator 4' extracts the characteristic parameter in accordance with the number of adjacent wirings of the respective wiring load models and the degree of the effect of the cross wiring and multiplies the characteristic parameter by the wiring length of the wiring load models, to thereby calculate the distributed constant (resistance R and capacitance C) of the respective wiring load models and output a distributed constant circuit data D14' to the delay time calculator 6.

The delay time calculator 6 calculates the signal propagation delay time of the logic circuit for the RC model as a function of the distributed constant circuit data D14'

In the third preferred embodiment, the effects of not only the adjacent wirings but also the cross wiring are taken into consideration in generation of the wiring load models and determination of the distributed constants of the respective wiring load models. This permits the characteristic data of the wiring load models to be determined more accurately than in the first and second preferred embodiments.

Similarly to the second preferred embodiment, the wiring load model integration unit and integrated wiring load distributed constant calculator may be provided between the wiring load distributed constant calculator 4' and delay time calculator 6 of the third preferred embodiment.

Figure 13:
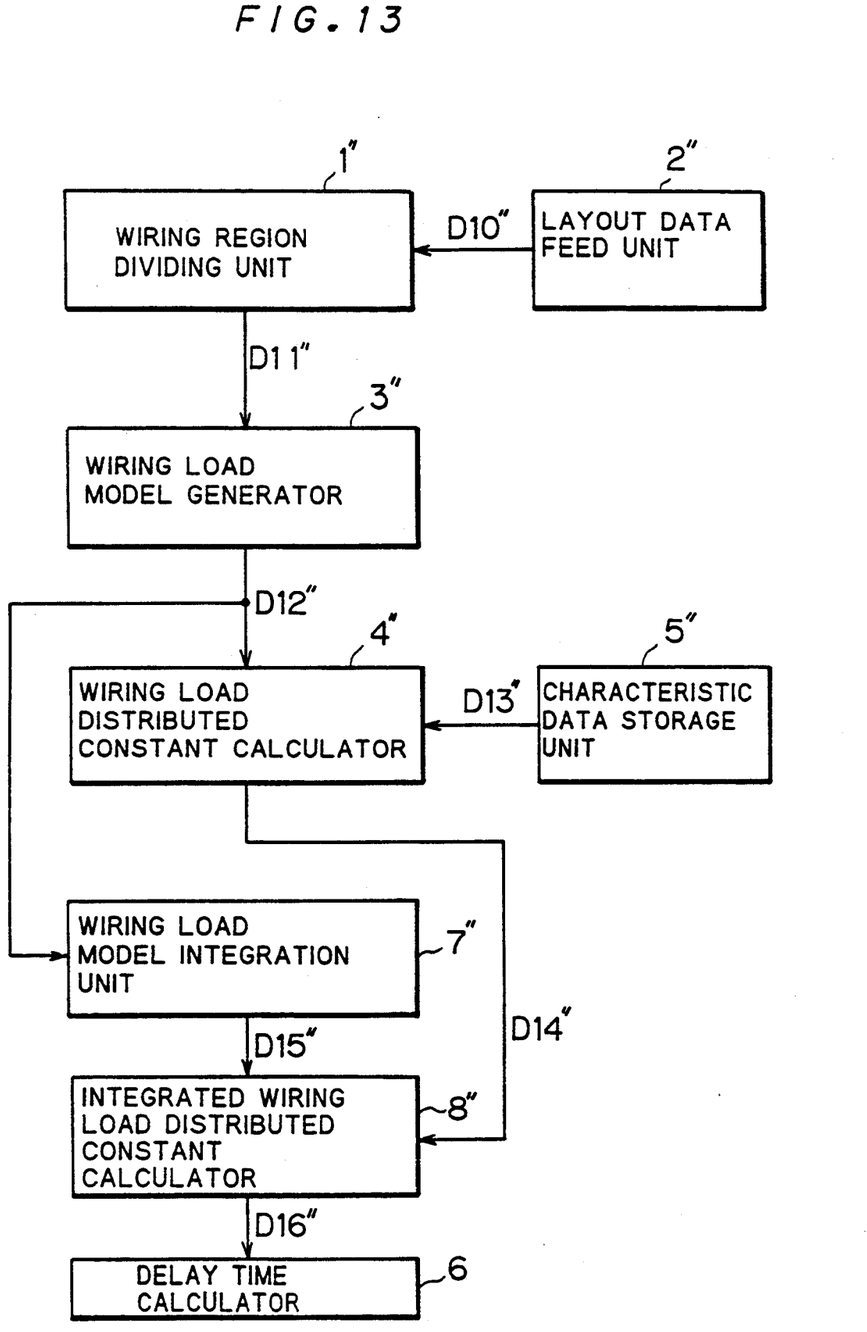
FIG. 13 is a block diagram of the logic simulator a fourth preferred embodiment according to the present invention.

FIG. 13 is a block diagram partially showing the logic simulator of a fourth preferred embodiment according to the present invention. A wiring region dividing unit 1" receives a wiring layout data D10" from a layout data feed unit 2" and performs on the wiring layout data D10" the wiring dividing processing based on the branch points, the number of adjacent wirings and the effect of the cross wiring, to output a divided wiring circuit data D11" to a wiring load model generator 3".

Figure 14:
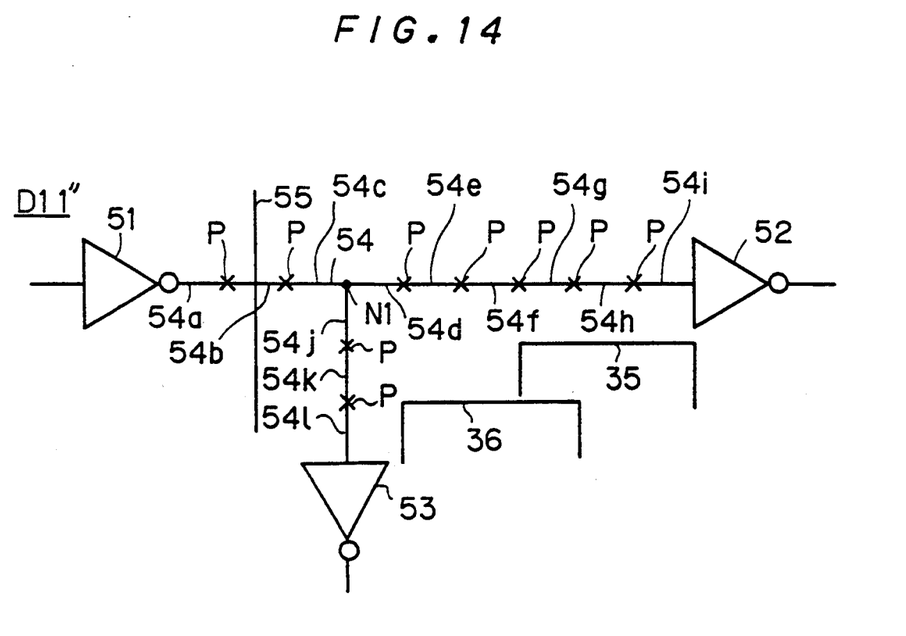
FIG. 14 illustrates an example of the divided wiring circuit data.

FIG. 14 is a circuit diagram showing an example of a divided wiring circuit data D12" having a cross wiring. In FIG. 14, reference numerals 51, 52 and 53 designate inverters; 54 designates a wiring between the inverters 51, 52 and 53; 55 designates a cross wiring which lies across the wiring 54; 35 and 36 designate other adjacent wirings which are not directly connected to the wiring 54.

As shown in FIG. 14, the wiring region dividing unit 1" divides the wiring 54 by setting dividing points P at equal intervals without regard to the number of adjacent wirings and the degree of the effect of the cross wiring, to output the divided wiring circuit data D11" having divided wiring regions 54a to 54l.

A wiring load model generator 3" receives the divided wiring circuit data D11" and outputs the wiring load model circuit data D12" including the wiring load model for each of the divided wiring regions to a wiring load distributed constant calculator 4".

Figure 15:
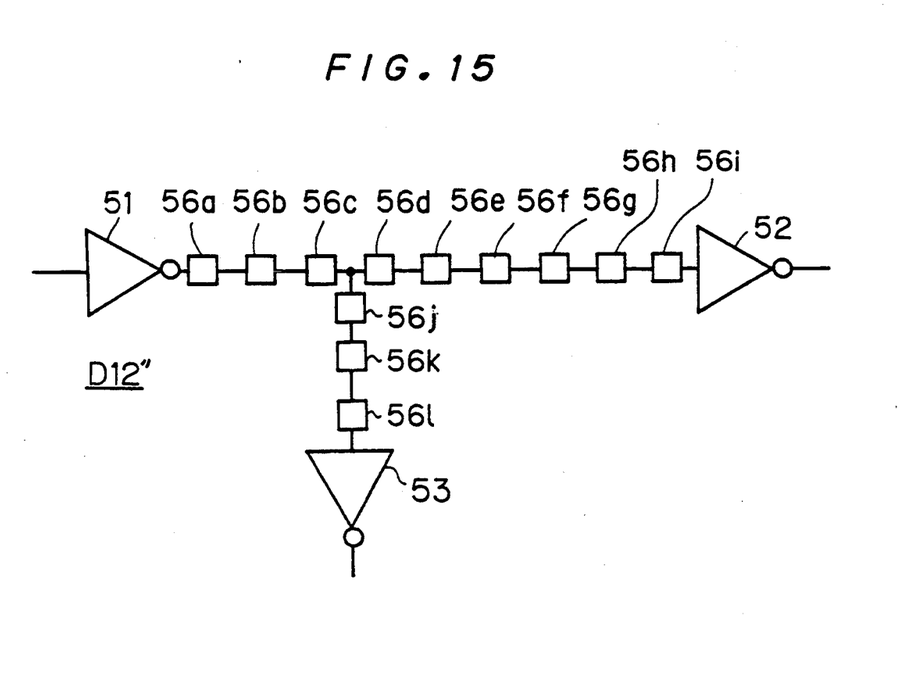
FIG. 15 illustrates an example of the wiring load model circuit data.

For example, the wiring load model generator 3", where receiving the divided wiring circuit data D11" shown in FIG. 14, outputs the wiring load model circuit data D12" including the wiring load models 55a to 55l for the divided wirings 54a to 54l respectively. Similarly to the third preferred embodiment, the number of adjacent wirings and the effect of the cross wiring are taken into consideration in classification of the wiring load models.

A characteristic data storage unit 5" stores a plurality of characteristic parameters which are the characteristic data of the wiring per unit length in the form of a unit length wiring characteristic data group D13" The characteristic parameters have different values in accordance with the number of adjacent wirings, from zero to two, of the wiring load model and the degree of the effect of the cross wiring.

The wiring load distributed constant calculator 4" receives the wiring load model circuit data D12" and also receives the unit length wiring characteristic data group D13" from the characteristic data storage unit 5". The wiring load distributed constant calculator 4" extracts the characteristic parameter in accordance with the number of adjacent wirings of the respective wiring load models and the degree of the effect of the cross wiring and multiplies the characteristic parameter by the wiring length of the wiring load models, to thereby calculate the distributed constants (resistance R and capacitance C) of the respective wiring load models and output a distributed constant circuit data D14".

A wiring load model integration unit 7" receives the wiring load model circuit data D12" from the wiring load model generator 3" and, similarly to the second preferred embodiment, integrates the wiring load models in the wiring load model circuit data D12" to output an integrated wiring load model circuit data D15" to an integrated wiring load distributed constant calculator 8".

On receiving the integrated wiring load model circuit data D15", the integrated wiring load distributed constant calculator 8" calculates the distributed constants (resistance R and capacitance C) of the respective integrated wiring load models with reference to the distributed constant circuit data D14" before integration to output an integrated distributed constant circuit data D16" to the delay time calculator 6.

The delay time calculator 6 calculates the signal propagation delay time of the logic circuit for the RC model as a function of the integrated distributed constant circuit data D16".

The fourth preferred embodiment in which the wiring load models are equally spaced on the wiring and are classified on the basis of the inter-wiring parasitic elements, is effective similarly to the second and third preferred embodiments.

An further improved accuracy is achieved by determination of the characteristic data of the wiring load models, with the wirings being divided at shorter intervals, in consideration for adjacent portions (center, end and the like) with the adjacent wirings and adjacent distances as well as the number of adjacent wirings and the degree of the effect of the cross wiring.

While the invention has been shown and described detail, the foregoing description is in all aspects illustrative and not restrictive. It is therefore understood that numerous modifications and variations can be devised without departing from the scope of the invention.

What is claimed is:

1. A logic simulator which functions to determine characteristic data of a wiring load of a logic circuit formed by a predetermined layout pattern, comprising:

layout pattern data feed means for feeding a layout pattern data specifying the layout pattern of said logic circuit;

wiring characteristic data storage means for storing characteristic parameters which are said characteristic data per unit length in corresponding relation to a plurality of types of wiring load models classified by a characteristic of a parasitic element incidental to a wiring;

wiring load model setting means for setting said wiring load models specified by the characteristic of the parasitic element incidental to said wiring on said wiring between elements of said logic circuit as a function of said layout pattern data to output a wiring load model circuit data; and characteristic data calculation means receiving from said characteristic data storage means said characteristic parameters corresponding to said wiring load models of said wiring load model circuit data for calculating said characteristic data of said wiring load models as a function of said characteristic parameters and wiring lengths of said wiring load models to output a calculated characteristic data wiring load model circuit data;

wherein said parasitic element incidental to said wiring is an inter-wiring parasitic element generated between said wiring and another adjacent wiring which is not directly connected to said wiring; and said wiring load model setting means includes:

wiring region dividing means for dividing said wiring between the elements of said logic circuit into divided wiring regions in accordance with the characteristic of said inter-wiring parasitic element generated between said wiring and said adjacent wiring which is not directly connected to said wiring as a function of said layout pattern data; and wiring load model generation means for providing said wiring load models specified by the characteristic of said inter-wiring parasitic element respectively for said divided wiring regions of said wiring to output said wiring load model circuit data.

2. The logic simulator of claim 1, further comprising:

wiring load model integration means receiving said wiring load model circuit data for producing a single integrated wiring load model from at least one of said wiring load models in said wiring load model circuit data to output an integrated wiring load model circuit data; and integrated wiring load model characteristic data calculation means for calculating said characteristic data of said integrated wiring load models in said integrated load model circuit data as a function of said calculated characteristic data wiring load model circuit data.

3. The logic simulator of claim 1, further comprising delay time calculation means for calculating a signal propagation delay time of said logic circuit as a function of said calculated characteristic data wiring load model circuit data.

4. The logic simulator of claim 1, wherein said characteristic data are distributed constants of a capacitance and a resistance.

5. The logic simulator of claim 1, wherein the characteristic of said inter-wiring parasitic element is classified by the number of adjacent wirings which are not directly connected to said wiring and by a degree of effect of a cross wiring which is not directly connected to said wiring and intersects said wiring two-dimensionally.

6. The logic simulator of claim 1, wherein the characteristic of said inter-wiring parasitic element is classifiied by the number of adjacent wirings which are not directly connected to said wiring.

7. The logic simulator of claim 6, wherein said wiring region dividing means divides said wiring in accordance with the number of adjacent wirings which are not directly connected to said wiring and at a branch point.

8. The logic simulator of claim 1, wherein said wiring load model setting means includes:

wiring region dividing means for dividing said wiring between the elements of said logic circuit at predetermined intervals as a function of said layout pattern data to provide divided wiring regions; and wiring load model generation means for providing said wiring load models specified by the characteristic of said inter-wiring parasitic element respectively for said divided wiring regions of said wiring to output said wiring load model circuit data.

9. The logic simulator of claim 8, wherein the characteristic of said inter-wiring parasitic element is classified by the number of adjacent wirings which are not directly connected to said wiring and by a degree of effect of a cross wiring which is not directly connected to said wiring and intersects said wiring two-dimensionally.

10. The logic simulator of claim 8, further comprising:

wiring load model integration means receiving said wiring load model circuit data for producing a single integrated wiring load model from at least one of said wiring load models in said wiring load model circuit data to output an integrated wiring load model circuit data; and integrated wiring load model characteristic data calculation means for calculating said characteristic data of said integrated wiring load models in said integrated load model circuit data as a function of said calculated characteristic data wiring load model circuit data.

* * * * *